Figure 1:
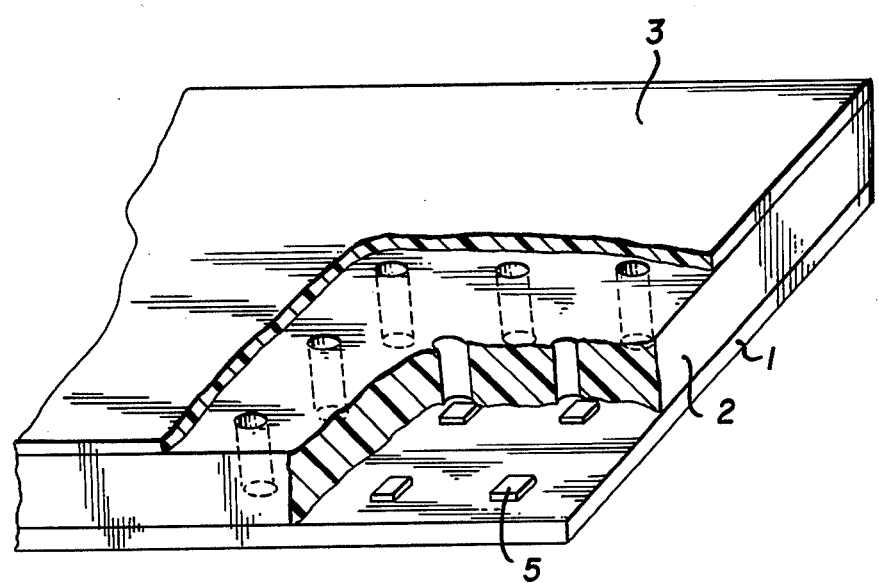

United States Patent [19]

Claus et al.

[11] Patent Number: 4,485,377
[45] Date of Patent: Nov. 27, 1984

[54] LED DISPLAYS WITH HIGH INFORMATION CONTENT

[75] Inventors: Günter Claus; Klaus Illgner; Helmut Jacques, all of Berlin, German Democratic Rep.

[73] Assignee: VEB Werk für Fernsehelektronik im VEB Kombinat Mikroelektronik, Berlin-Oberschöneweide, German Democratic Rep.

[21] Appl. No.: 405,111

[22] Filed: Aug. 4, 1982

[30] Foreign Application Priority Data

Aug. 12, 1981 [DD] German Democratic Rep. ................................. 2325640

[51] Int. Cl.$^3$ ............................................. G09G 3/32
[52] U.S. Cl. ................................. 340/719; 340/782; 357/17; 313/500; 313/505
[58] Field of Search ............. 340/782, 762, 795, 752, 340/719, 718; 357/17; 313/500, 505

[56] References Cited

U.S. PATENT DOCUMENTS

| | | | |
|---|---|---|---|
| 3,558,974 | 1/1971 | Stewart | 340/782 |
| 3,737,704 | 6/1973 | Grenon et al. | 340/782 |
| 3,821,616 | 6/1974 | Kravitz | 340/782 |
| 3,893,149 | 7/1975 | Grenon | 340/782 |
| 3,940,756 | 2/1976 | Findlay | 340/782 |
| 4,271,408 | 6/1981 | Teshima et al. | 340/782 |
| 4,306,716 | 12/1981 | James et al. | 340/762 |
| 4,445,132 | 4/1984 | Ichikawa et al. | 340/719 |

*Primary Examiner*—Gerald L. Brigance
*Attorney, Agent, or Firm*—Jordan and Hamburg

[57] ABSTRACT

The invention relates to light emitting semi-conductor components, in which the individual chips are located at the cross-points between two mutually vertically oriented systems of parallel conducting paths, so that line- or matrix forms are created. Such components are used to produce electro-optical exhibits of numbers, letters or symbols, for instance, in the optical exhibit of recorded material.

The invention employs only one supporting substrate with recesses for the semi-conductor light emitter chips and for the distribution of light as well, with at least one conducting path system, which is connected by means of conducting and non-conducting adhesives on the viewing side to a diffusion film, and on the backside to a flexible, conducting plate, which supports the semi-conductor chips.

15 Claims, 6 Drawing Figures

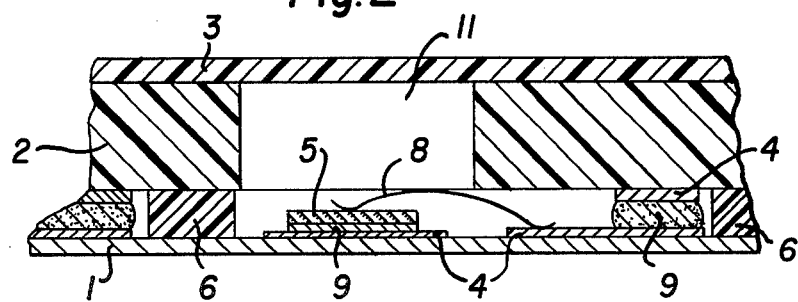
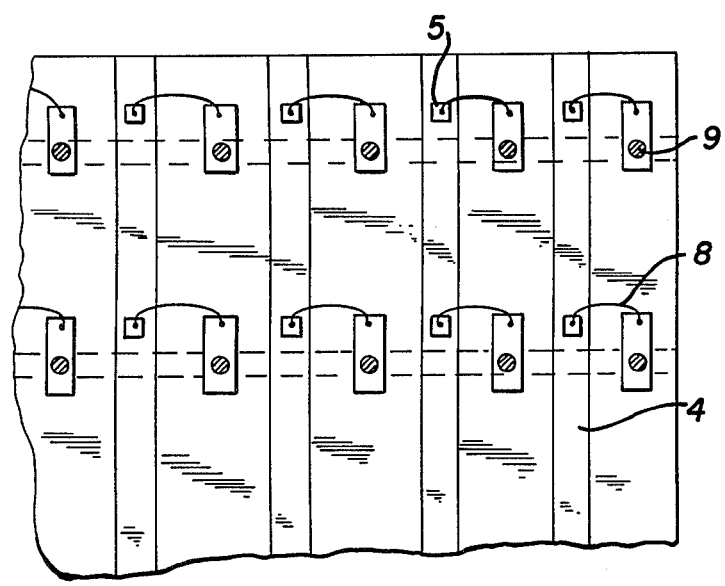

LED DISPLAYS WITH HIGH INFORMATION CONTENT

The invention relates to light emitting semi-conductor components, in which the individual emitting elements are arranged adjacent to one another linearly or planarly in line- or matrix form and optically decoupled from one another.

Such components are used in the electro-optical production of numbers, signs, letters and symbols. In modern machines and instruments with information storage, they serve the optical display of the stored content or the display of numerical series or texts to be entered.

It is known, that LED semi-conductor chips can be mounted on metallized support plates, for instance, of ceramic or glass fiber reinforced plastic materials, and connected to each other either in columns or in rows. Such arrangements are, for example, used in so called alpha-numeric displays, which are offered in one or more digits. Such solutions are described, for example, in WP 140 301 and WP 218 224.

It is further known, that electro-optical matrix arrangements are advantageously producable, when one spreads the light emitted from the semi-conductor chips almost evenly over a larger area via so called light tunnel arrangements. Thus a large display is made possible, however, without increasing the dot density and thus the information content, with a low consumption of cost intensive semi-conductor materials on an $A^{III}B^V$ base. The light tunnel principle, the function of which is the optimal illumination of large symbol areas through small, light intensive semi-conductor emitters, is described, for example, in AS No. 2 405 829 and OS No. 2 542 095. In these cases the light tunnel always has an optically enlarging function due to spreading.

Finally, there are a number of technical solutions for the recovery of information, which depend on the mounting of individual LED's in matrixes, in which an optical enlargement of the matrix arrangement is achieved via a lenticular arrangement (WP 140 301).

All known solutions have the disadvantage in common that they do not allow large displays at simultaneous increase of the light dot number and thus the information content. Either large, self-supporting protective covers and very long wire-chain-bondages from chip to chip would be necessary, which is unfavorable from a mechanical and technical standpoint, or the displays would offer no possibility of high light dot concentration, because of the geometrical extension of the individual dot.

The previously known technical solutions always have at least two mechanically rigid construction elements. Either a stable protective cover is mounted on the equally stable chip carrier—which is, for instance, a ceramic plate—, or a light carrying construction, for instance, an arrangement of so called light tunnels is first mounted on the stable chip carrier, and then this rigid unit is fixed in a protective cover, usually with a cast resin by means of a rear casting.

The manufacture of large components, for instance, of die-cast parts with high mechanical precision, is technically difficult and therefore expensive. This main reason has prevented the realization of light emitting semi-conductor components as large dot matrixes to display texts.

It is the aim of the invention to avoid the aforementioned disadvantages and to create a new display possibility for numbers, letters and other symbols on a semi-conductor base, whereby the area of extension should be limited for reasons of suitability to its respective use, but not in principle.

The invention is based on the task of producing a new structure for LED displays with high information content. As a result it is insured that as high as possible dot density combined with low component number is achieved.

Finally, solutions had to be found, allowing a flexible realization of such displays. Because of their higher dot density, the displays allow the simultaneous display of several text lines, for which dot matrixes with more than 1.000 dots are suitable.

According to the invention, this task is solved in that a large LED-matrix- or line assembly component, in which the semi-conductor emitter chips are arranged at the cross-points of two systems of parallel conducting channels, oriented perpendicular to one another, contains only one support component in the form of a planar extended, substrate, which in certain cases can be flexible to a limited extent.

The substrate has recesses for semi-conductor chips and bonding wires, the recesses also serving as light conducting tunnels, and the substrate also having at least one conducting plane.

The conducting plane consists, for instance, of vapor deposited metal conducting strips, which run in a parallel fashion and serve to contact the contacts of the p- or n-side of the light emitting semi-conductor chips. A flexible conducting plate, which carries the semi-conductor chips, and is attached to the substrate by means of either conducting or non-conducting strips, also has conducting channels to contact the n- or p-contacts of the semi-conductor chips, which are preferably oriented vertically to the metallic conducting paths of the substrate.

Surprisingly enough, stable contacts between semi-conductor and flexible conducting plate, on the one hand, as well as semi-conductor and substrate with conducting paths, on the other hand, can be obtained by means of suitable metallizing. The substrate has a self-adhering diffusion film on the viewing side.

Collectively, the described measures result in a component, which contains a system of parallel conducting paths, for instance, in a vertical direction, and a second system, in a horizontal direction, and in which a semi-conductive light emitting chip is located at every cross-point of the conducting paths. The electronic control of such matrix arrangements is known in principle, and only differs from the suggested arrangement by the number of rows or columns, which are to be controlled. By using such control electronics, a desired pattern of semi-conductor light emitters is established when in operation. The light they emit can only be spread out inside the recesses of the substrate and hits the diffusion film following manifold reflections on the walls of the recesses, which by using the optical diffusion of homogeneous light dots inside the matrix, creates a symbol, which can be seen by the human eye.

Figure 4:
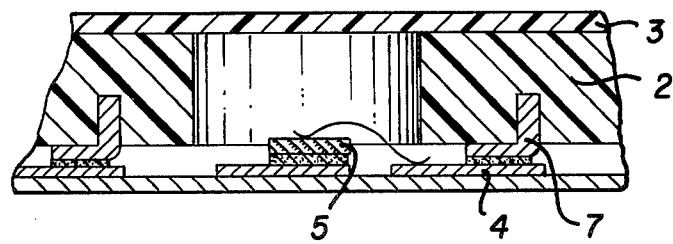
Figure 5:
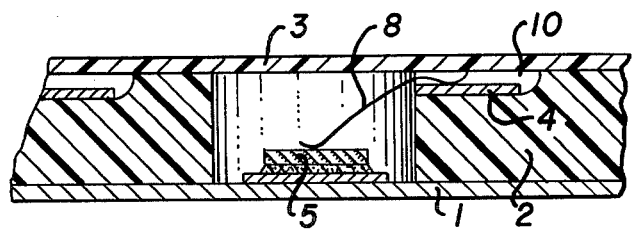
Figure 6:
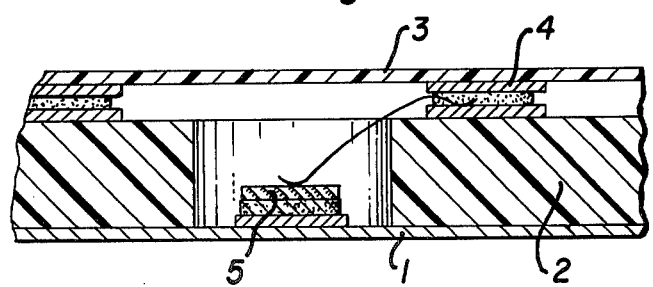

The invention will be explained in detail on the basis of examples. The accompanying drawing shows:

FIG. 1: Principle construction of the arrangement according to the invention;

FIG. 2: Cross-section through a light dot;

FIG. 3: Diagram of the conducting path routing;

FIG. 4: Cross-section through a light dot with angular material as a conducting path;

FIG. 5: Cross-section through a light dot with metallized groove in the substrate;

FIG. 6: Cross-section through a light dot with the conducting path on the diffusion film.

The supporting element of the arrangement is substrate 2 according to FIG. 1, made from a plastic material with reflecting factor as high as possible.

The recesses 11 offer room for the semi-conductor light emitter chips 5 and bonding wires 8, however, in contrast to the state of art, they have no optically enlarging function.

The special feature of substrate 2 lies in the fact that it has conductor paths 4, arranged in columns, on the bottom side, corresponding to the lateral chip distance, and connected to the bonding islands on the flexible conducting plate 1 adjacent to the bonding plate of the p-contact by means of conducting strip 9, in an electrically conducting and mechanically firm fashion (FIGS. 2 and 3). The self-adhering diffusion film 3 is chosen in accordance with the emission color of the chip; these films are conventional in the trade.

The flexible conducting plate 1 has conductor paths 4, which connect the chip islands to each other electrically either in the form of rows or columns. Metallic bonding islands are located between the rows or columns, onto which are attached the bonding wires of the p-contacts of the LED-chips by means of known wire bonding methods.

In order to avoid short circuits between column- and row conducting channels, it is suitable to insert a spacing foil or a spacing cross-piece 6, which contains the recesses for chip 5, bonding wire 8 and conducting adhesive island 9. The entire LED-matrix can be evenly connected by rolling.

In the case that a reinforcement of the substrate becomes necessary, angular material 7, for instance in the form of support strip bronze, can, according to FIG. 4, be fit into or pressed into the plastic body. This material has a material thickness of, for example, 0.15 mm and can at the same time serve as a spacing cross-piece; the insertion of an additional spacing foil is thus eliminated.

A further example provides for groove arrangements 10 on the substrate, according to FIG. 5, the basic surface of which is metallized, for example, by vapor deposition, so that bondable layers are created. The metallized groove arrangement 4 replaces the metallic conductors on the bottom side of the substrate. In this case, the flexible conducting plate, having semi-conductor chips mounted thereon, is attached to the substrate by any kind of commercial adhesive prior to the operation of wire bonding. The wire bonding of the p-contact is established from the chip to the conducting groove. The diffusion film can subsequently be rolled on.

Finally, the example according to FIG. 6 provides for conducting paths 4 in columns on the diffusion film 3, which at the same time is manufactured as a flexible conducting plate. The substrate has, in this connection, only bonding islands, on which wire 8 is attached from the area of the p-contact. The columnar contact is adhesive by means of the rolled on diffusion film 3, the conducting paths 4 of which have to be glued in a conducting manner to the substrate, at least localized at the bonding areas.

Such an arrangement has the advantage that on the basis of a 1 mm thick substrate, without reinforcement, the entire arrangement can be made in a partly flexible manner.

We claim:

1. In an LED display with high information content, comprised of semi-conductor light emitter chips arranged at the cross-points of two mutually perpendicular systems of parallel conducting paths; the improvement wherein said display is comprised of a support component in the form of a planar substrate of plastic material with a high reflection factor, said substrate having recesses for receiving said semi-conductor chips, said recesses serving as light conducting tunnels, said substrate having at least one conducting path plane for the control of semi-conductor chips, one side of said substrate being connected via conducting or non-conducting adhesives to a flexible conducting plate which carries said semi-conductor chips, the other side of said substrate being connected to a self-adhering diffusion film, said substrate comprising the sole support element of said display.

2. LED display according to claim 1, wherein the conducting path plane on the substrate is an evaporated metallic coating.

3. LED display according to claim 2, wherein a spacing film is arranged between the conducting path plane on the substrate and the flexible conducting plate, said spacing film having recesses for the chips and bonded connections in said display.

4. LED display according to claim 1, wherein the conducting path plane on the substrate is comprised of reinforcing supporting strips, having angular cross sections inserted in said substrate.

5. LED display according to claim 1, wherein said other side of the substrate has groove indentations, arranged in columns, the bottoms of which are bondably metallized, and further comprising wire bond connections extending through the recesses in the substrate into which the chips extend and connected to the bondably metallized groove.

6. LED display according to claim 1, wherein the conducting system on the substrate is comprised of metallized bonding islands, to which bonding wires are connected from the p-contact of the chips, and wherein a system of parallel conducting paths is arranged on the diffusion film and connected to the bonding islands by means of conducting adhesive.

7. LED-display according to claim 1, wherein the substrate itself is a non-transparent flexible plate, so that in combination with flexible semi-conductors and flexible diffusion film, the entire arrangement is flexible.

8. LED display according to claim 1, wherein said flexible diffusion film carries conducting paths, by means of which, using film bonding, a direct connection is formed between the semi-conductor chips and the conducting paths on the diffusion film.

9. The LED display of claim 1 wherein said substrate is of a soft flat material, and one of said systems of parallel conductive paths comprises metal supporting strips having angular cross-sections and inserted in said substrate for strengthening said substrate.

10. The LED display of claim 1 comprising a spacing film between said substrate and flexible conducting plate and adhered to said substrate and flexible conducting plate, said spacing film having apertures for receiving said semi-conductor chips.

11. The LED display of claim 1 wherein said substrate has conducting bonding islands on said other side immediately at the edge of said recesses, said semi-conductor chips having small p-electrodes connected to said bonding islands by wires, said diffusion film comprising a system of parallel conductive paths conductively contacting said bonding islands.

12. The LED display of claim 1 wherein said substrate comprises a non-transparent flexible conducting plate, said diffusion film being flexible, whereby said display is flexible.

13. The LED display of claim 1 wherein said diffusion film is provided with conductive strips, said display being arranged to provide direct electrical connection between said semi-conductor chips and the conducting strips on said diffusion film.

14. In an LED-display comprising a plurality of light emitting chips each positioned at a separate crosspoint of first and second mutually perpendicular systems of parallel conducting means; the improvement wherein said display comprises a planar support of a plastic material having a high reflection factor, said support having recesses aligned with said light emitting chips whereby said recesses serve as light conducting tunnels, said first conductor system comprising conducting means in a plane on said support, flexible conducting plate means supporting said light emitting chips and adhesively affixed to one side of said support, said second conductor system comprising conductor means on said flexible plate means, and a self-adhering diffusion film affixed to the other side of said support, said support comprising the sole structural support of said display.

15. The LED-display of claim 14 wherein said first conductor system comprises an evaporated metallic coating on said support.

* * * * *